United States Patent
Liu et al.

(10) Patent No.: US 10,290,783 B2
(45) Date of Patent: May 14, 2019

(54) LED BRACKET, LED DEVICE AND LED DISPLAY SCREEN

(71) Applicant: Foshan NationStar Optoelectronics Co., Ltd., Foshan (CN)

(72) Inventors: Chuanbiao Liu, Foshan (CN); Xiaofeng Liu, Foshan (CN); Zongxian Xie, Foshan (CN); Qiang Zhao, Foshan (CN); Kailiang Fan, Foshan (CN); Kuai Qin, Foshan (CN); Lu Yang, Foshan (CN)

(73) Assignee: Foshan NationStar Optoelectronics Co., Ltd., Foshan (CN)

( * ) Notice: Subject to any disclaimer, the term of this patent is extended or adjusted under 35 U.S.C. 154(b) by 0 days.

(21) Appl. No.: 15/711,057

(22) Filed: Sep. 21, 2017

(65) Prior Publication Data

US 2018/0083171 A1    Mar. 22, 2018

(30) Foreign Application Priority Data

Sep. 21, 2016   (CN) .................. 2016 2 1075963 U
Sep. 26, 2016   (CN) .................. 2016 2 1084479 U
Oct. 20, 2016   (CN) .................. 2016 2 1141556 U (51) Int. Cl.
| | |
|---|---|
| *H01L 33/62* | (2010.01) |
| *H01L 33/52* | (2010.01) |
| *H01L 33/60* | (2010.01) |
| *H01L 33/44* | (2010.01) |
| *H01L 33/48* | (2010.01) |

(52) U.S. Cl.
CPC ............. *H01L 33/60* (2013.01); *H01L 33/44* (2013.01); *H01L 33/486* (2013.01); *H01L 33/52* (2013.01); *H01L 33/62* (2013.01)

(58) Field of Classification Search
CPC ......... H01L 33/60; H01L 33/62; H01L 33/52; H01L 33/44; H01L 33/486
See application file for complete search history.

(56) References Cited

U.S. PATENT DOCUMENTS

| | | | |
|---|---|---|---|
| 2007/0080361 A1* | 4/2007 | Malm ................. | B82Y 20/00 257/99 |
| 2009/0160084 A1* | 6/2009 | Kuratomi ............. | H01L 21/565 264/219 |
| 2009/0231857 A1* | 9/2009 | Ito ....................... | H01H 13/83 362/311.14 |

(Continued)

FOREIGN PATENT DOCUMENTS

JP   2005285874 A   10/2005

OTHER PUBLICATIONS

Korean Intellectual Property Office, Notification of Reason for Refusal, Application No. 10-2017-0121881, dated Jun. 14, 2018.

*Primary Examiner* — Caridad Everhart
(74) *Attorney, Agent, or Firm* — LKGlobal | Lorenz & Kopf, LLP (57) ABSTRACT

An LED bracket, an LED device and an LED display screen are disclosed. The LED bracket includes a metal bracket and a cup cover wrapping the metal bracket. The metal bracket includes a first metal pin embedded into the cup cover and a second metal pin exposed from the cup cover. A part, located on a top of the second metal pin, in the cup cover is a reflection cup. A light absorbing layer is disposed on a part of an outer side face of the reflection cup.

19 Claims, 7 Drawing Sheets

(56) References Cited

U.S. PATENT DOCUMENTS

| | | | |
|---|---|---|---|
| 2011/0006334 A1* | 1/2011 | Ishii | C09K 11/584 257/98 |
| 2012/0134178 A1* | 5/2012 | Park | H01L 33/486 362/609 |
| 2012/0206934 A1* | 8/2012 | Kim | H01L 25/167 362/602 |
| 2012/0241790 A1* | 9/2012 | Ke | H01L 33/60 257/98 |
| 2014/0036508 A1* | 2/2014 | Ou | H01L 33/486 362/267 |

* cited by examiner

FIG. 17

LED BRACKET, LED DEVICE AND LED DISPLAY SCREEN

CROSS-REFERENCE TO RELATED APPLICATION

This application claims priority to Chinese Application No. 201621075963.9, filed Sep. 21, 2016, Chinese Application No. 201621084479.2, filed Sep. 26, 2016, and Chinese Application No. 201621141556.3, filed Oct. 20, 2016, which are hereby incorporated herein by reference in their entirety.

TECHNICAL FIELD

The present disclosure relates to the technical field of Light Emitting Diode (LED), and particularly relates to an LED bracket, an LED device and an LED display screen.

BACKGROUND

An LED device generally includes an LED bracket, an LED chip and an encapsulation colloid. The LED bracket includes a metal bracket and a cup cover wrapping the metal bracket. When the LED device is working, a PN junction of the LED chip is energized and conducted, and the LED chip converts electric energy into light energy to emit light rays. The LED bracket, the LED chip or the encapsulation colloid may influence a light emitting effect or display effect of an LED product.

For example, a contrast ratio, as an important index for measuring the display effect of the LED product, may generate an important influence on the display effect and a visual effect of human eyes. Generally speaking, the larger the contrast ratio is, the more clear and striking images are and the more bright and beautiful colors are. If the contrast ratio is smaller, an entire display picture formed by the LED may present a dusky phenomenon, thereby seriously affecting an appreciation effect on the human eyes.

SUMMARY

An embodiment of the present invention provides an LED bracket, including a metal bracket and a cup cover wrapping the metal bracket. The metal bracket includes a first metal pin embedded into the cup cover and a second metal pin exposed from the cup cover. A part, which is located on a top of the second metal pin, in the cup cover is a reflection cup. A light absorbing layer is disposed on a part of an outer side face of the reflection cup.

An embodiment of the present invention further provides an LED device, including an LED bracket, an LED chip and an encapsulation colloid, wherein the LED bracket comprises a metal bracket and a cup cover wrapping the metal bracket, the metal bracket comprises a first metal pin embedded into the cup cover and a second metal pin exposed from the cup cover, a part, located on a top of the second metal pin, in the cup cover is a reflection cup, and a light absorbing layer is disposed on a part of an outer side face of the reflection cup. The LED chip is mounted in the reflection cup of the LED bracket. The encapsulation colloid covers the LED chip.

An embodiment of the present invention further provides an LED display screen, including an LED device, wherein the LED device comprises an LED bracket, an LED chip and an encapsulation colloid; wherein, the LED bracket comprises a metal bracket and a cup cover wrapping the metal bracket, the metal bracket comprises a first metal pin embedded into the cup cover and a second metal pin exposed from the cup cover, a part, located on a top of the second metal pin, in the cup cover is a reflection cup, and a light absorbing layer is disposed on a part of an outer side face of the reflection cup. The LED chip is assembled in the reflection cup of the LED bracket. The encapsulation colloid covers the LED chip.

A list of reference numerals:

1: LED bracket;         11: Metal bracket;
12: Cup cover;          13: Light absorbing layer;

| | |
|---|---|
| 14: Bonding pad; | 15: River channel; |
| 16: First bonding pad group; | 17: Second bonding pad group; |
| 18: Third bonding pad group; | 111: First metal pin; |
| 112: Second metal pin; | 121: Reflection cup; |
| 122: Cup opening; | 123: two opposite walls; |
| 124: Vertical plane; | 125: Inner side face; |
| 131: First light absorbing layer; | 132: Second light absorbing layer; |
| 133: Third light absorbing layer; | 141: First bonding pad; |
| 142: Second bonding pad; | 143: First die bonding pad; |
| 144: First common wiring bonding pad; | 145: First electrode bonding pad; |
| 146: Second die bonding pad; | 147: Second common wiring bonding pad; |
| 148: Second electrode bonding pad; | 149: Third electrode bonding pad; |
| 151: First river channel; | 152: Second river channel; |
| 153: Third river channel; | 154: Fourth river channel; |
| 155: Fifth river channel; | 156: Sixth river channel; |
| 157: Seventh river channel; | 158: Eighth river channel; |
| 2: LED chip; | 21: First LED chip; |
| 22: Second LED chip; | 23: Third LED chip; |
| 24: Fourth LED chip; | 25: Fifth LED chip; |
| 26: Sixth LED chip; | 27: Seventh LED chip; |
| 28: Eighth LED chip; | 3: Encapsulation colloid. |

DETAILED DESCRIPTION

The embodiments of the present invention will be clearly and fully described below in combination with drawings. Described embodiments are merely some embodiments of the present invention, not all the embodiments.

In description of the embodiments of the present invention, unless otherwise explicitly specified and defined, terms of "connect", "connection" and "fix" shall be understood in broad sense, and for example, may refer to fixed connection, detachable connection or integrated connection, may refer to mechanical connection or electrical connection, may refer to direct connection, indirect connection through an intermediate medium, and may refer to communication in two elements or an interaction relationship between two elements. For those ordinary skilled in the art, specific meanings of the above terms in the embodiments of the present invention can be understood according to specific conditions.

In embodiments of the present invention, unless otherwise explicitly specified and defined, a condition that a first feature is "above" or "below" a second feature may include direct contact between the first feature and the second feature, and may also include contact through additional features between the first feature and the second feature rather than direct contact between the first feature and the second feature. Moreover, a condition that the first feature is "above", "on" and "upon" the second feature may include that the first feature is right above or at the inclined top of the second feature, or only indicates that a horizontal height of the first feature is higher than that of the second feature. A condition that the first feature is "below", "under" and "underneath" the second feature may include that the first feature is right below or inclined downward to the second feature, or only indicates that a horizontal height of the first feature is lower than that of the second feature.

Figure 1:
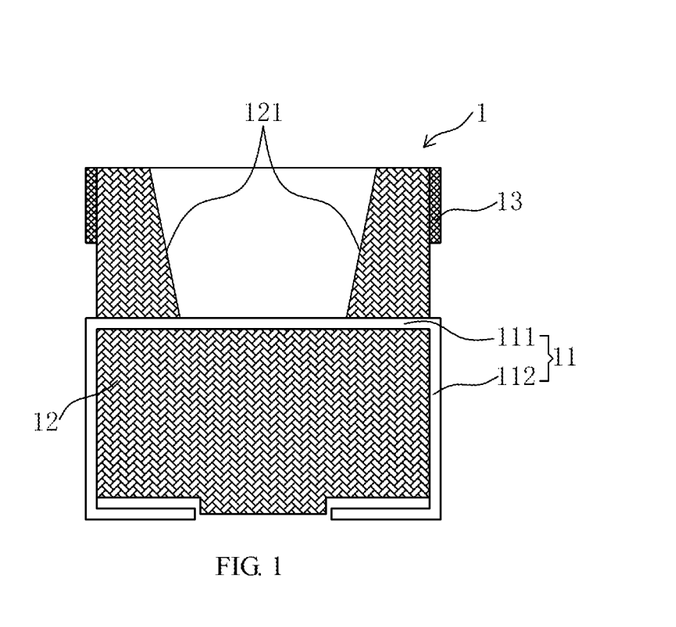
FIG. 1 is a structural schematic diagram illustrating a non-limiting embodiment of an LED bracket made in accordance with the teachings of the present disclosure.

FIG. 1 is a structural schematic diagram illustrating an LED bracket provided in an embodiment of the present invention. By referring to FIG. 1, the LED bracket 1 includes: a metal bracket 11 and a cup cover 12 wrapping the metal bracket 11. The metal bracket 11 includes a first metal pin 111 embedded into the cup cover 12 and a second metal pin 112 exposed from the cup cover 12. A part, located on a top of the second metal pin 112, in the cup cover 12 is a reflection cup 121. A light absorbing layer 13 is disposed on a part of an outer side face of the reflection cup 121.

Generally, requirements for a contrast ratio are different for outdoor and indoor LED devices. The indoor LED devices have lower requirements for luminance, and the contrast ratio can be increased by using black Polyphthalamide (PPA) material. The outdoor LED devices have higher requirements for luminance, and if only the black PPA material is used for increasing the contrast ratio, the luminance is reduced since the black PPA greatly absorbs lights, which causes reduction of the luminance of the outdoor LED devices. Therefore, in a related art, to ensure the contrast ratio and the luminance of the outdoor LED devices, a structure of an LED bracket of the outdoor LED device is modified to an "outer black and inner white" structure. Namely, after white PPA material is used, a secondary injection molding is performed on a part of an upper surface and an outer side wall of a white PPA bracket formed by the white PPA material to inject the black PPA material. However, the following disadvantages may be caused by the manner of the secondary injection molding for injecting the black PPA material into the upper surface and the outer side wall of the white PPA bracket: not only manufacturing process is complex and manufacturing cost is high, but also layering may be easily generated due to low adhesion degree between the white PPA bracket and the black PPA material after injection molding, thereby influencing the use effect of the device.

Figure 2:
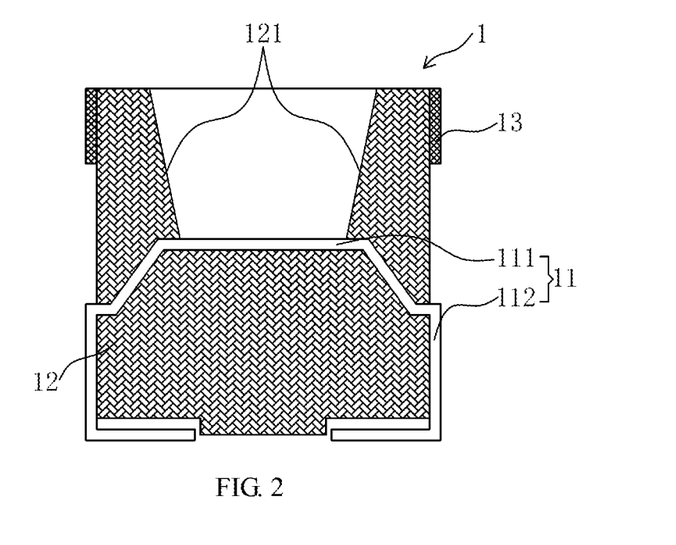
FIG. 2 is a structural schematic diagram illustrating another non-limiting embodiment of an LED bracket made in accordance with the teachings of the present disclosure.

In the LED bracket provided in the embodiments, the structure of the first metal pin 111 may have at least two structures. For example, as shown in FIG. 1, the first metal pin 111 is a non-bending structure, and as shown in FIG. 2, the first metal pin 111 is a bending structure.

In the embodiment of the present invention, to replace the PPA material in the related art, the light absorbing layer 13 may be disposed on the part of the outer side face of the reflection cup 121, and the light absorbing layer 13 is used for absorbing external light rays. Then, the contrast ratio of the LED device can be increased, and the use of the material can be reduced as much as possible, thereby not only reducing the cost, but also reducing manufacture difficulty. The LED bracket in the embodiment has a better use effect for the LED device in an outdoor scene.

Embodiments of the present invention further provide an LED display screen and an LED device including the LED bracket. It is beneficial to increasing the contrast ratio of the LED device and the LED display screen, reducing the manufacturing difficulty and the manufacturing cost, and ensuring stability and the use effect of the LED device and the LED display screen.

By referring to FIG. 1, the light absorbing layer 13 is extended from the top of the outer side face of the reflection cup 121 to a position close to a bottom of the outer side face of the reflection cup 121. The light absorbing layer 13 in the embodiment is disposed on an upper part of the outer side face of the reflection cup 121 (as shown in FIG. 1), which can reduce the use of the material while ensuring the contrast ratio to further reduce the cost.

Figure 3:
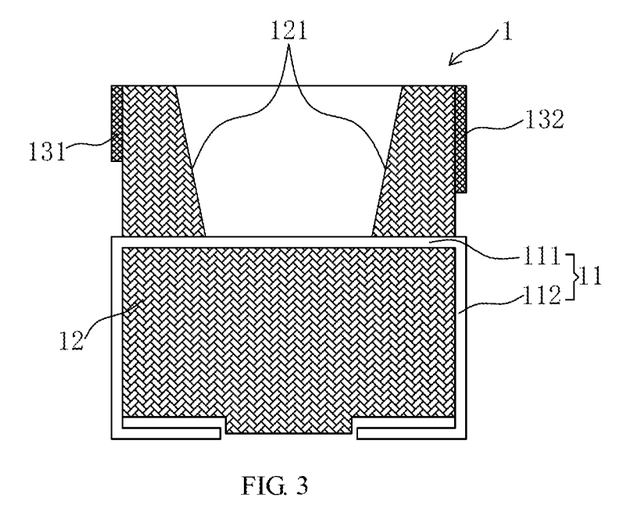
FIG. 3 is a structural schematic diagram illustrating another non-limiting embodiment of an LED bracket made in accordance with the teachings of the present disclosure.

By referring to FIG. 3, in another embodiment of the present invention, the light absorbing layer 13 includes a first light absorbing layer 131 disposed on a first outer side face of the reflection cup 121 and a second light absorbing layer 132 arranged on a second outer side face of the reflection cup 121. A height of the first light absorbing layer 131 is smaller than a height of the second light absorbing layer 132. In the embodiment of the present invention, the light absorbing layers 13 on different outer side faces of the reflection cup 121 may have different heights to adapt to needs of different application scenes.

Figure 4:
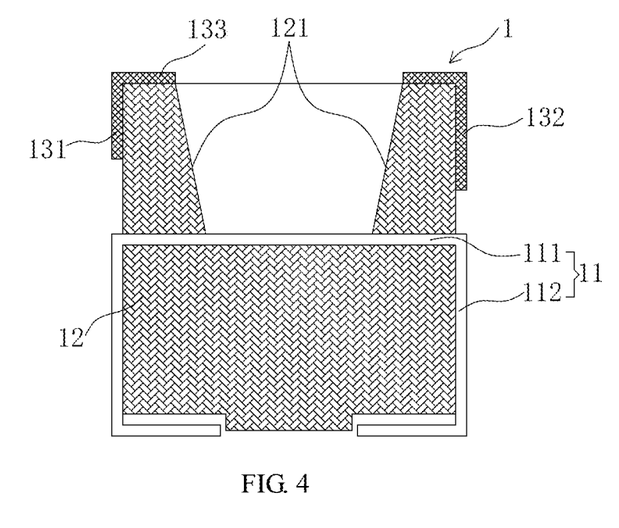
FIG. 4 is a structural schematic diagram illustrating another non-limiting embodiment of an LED bracket made in accordance with the teachings of the present disclosure.

By referring to FIG. 4, in another embodiment of the present invention, a third light absorbing layer 133 may be disposed on a surface of a top of the reflection cup 121, which can further increase the contrast ratio of the LED device.

Figure 5:
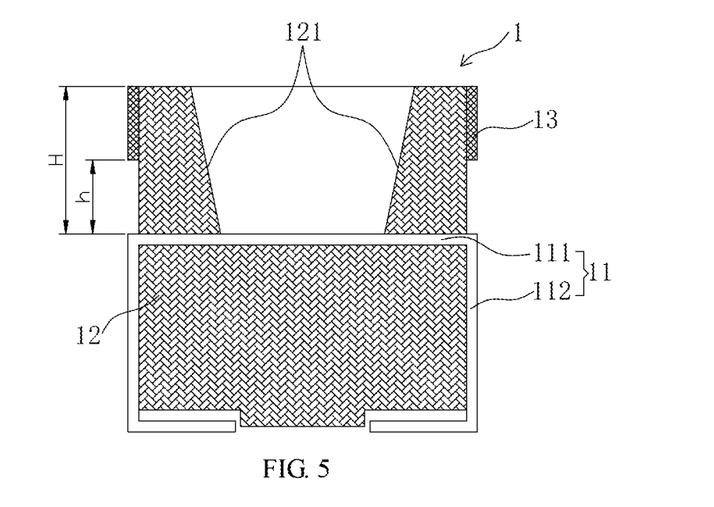
FIG. 5 is a structural schematic diagram illustrating another non-limiting embodiment of an LED bracket made in accordance with the teachings of the present disclosure.

By referring to FIG. 5, in another embodiment of the present invention, a vertical height H of the reflection cup 121 and a vertical distance h between a bottom surface of the light absorbing layer 13 and a bottom of the outer side face of the reflection cup 121 meet a relational expression: $0 \leq h \leq \frac{2}{3}H$, wherein the vertical distance h can also be represented as h between a surface of a bottom end of the light absorbing layer 13 of the outer side surface of the reflection cup 121 and a bottom surface of a cup bottom of the reflection cup 121. With the vertical distance h between the bottom surface of the light absorbing layer 13 and the bottom of the outer side face of the reflection cup 121, it may achieve an effect of sufficiently saving the material on a premise of ensuring the contrast ratio.

As a better range, a vertical height H of the reflection cup 121 and a vertical distance h between a bottom surface of the light absorbing layer 13 and a bottom of the outer side face of the reflection cup 121 meet a relational expression: $\frac{1}{3}H \leq h \leq \frac{1}{2}H$.

In an example of the present invention, the light absorbing layer 13 is a black ink layer or black paint layer. A black coating used is favorable for absorbing the external light rays. The ink layer or the paint layer is combined with the reflection cup 121 in a printing or spraying mode, thereby increasing the combination strength, ensuring structural stability of the bracket and effectively reducing the material cost.

Figure 6:
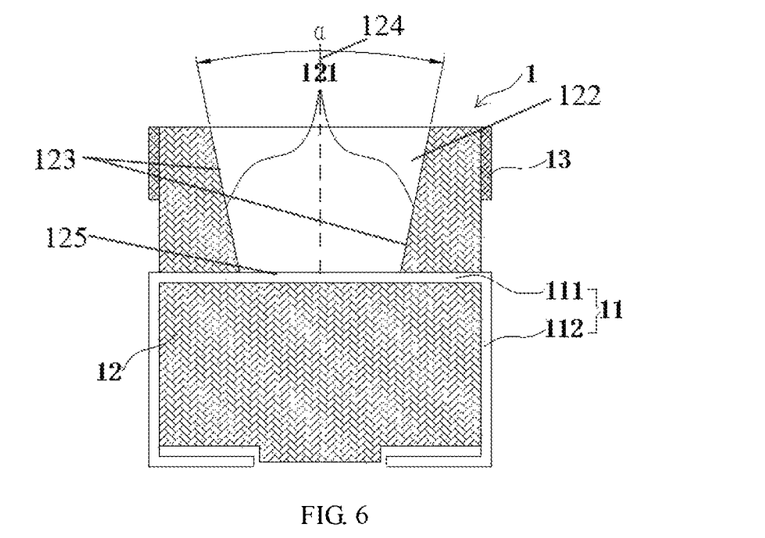
FIG. 6 is a structural schematic diagram illustrating another non-limiting embodiment of an LED bracket made in accordance with the teachings of the present disclosure.

FIG. 6 is a structural schematic diagram illustrating another LED bracket provided in an embodiment of the present invention. By referring to FIG. 6, in the embodiment, the LED bracket 1 includes: a metal bracket 11 and a cup cover 12 wrapping the metal bracket 11. The metal bracket 11 includes a first metal pin 111 embedded into the cup cover 12 and a second metal pin 112 exposed from the cup cover 12. A part, located on a top of the second metal pin 112, in the cup cover 12 is a reflection cup 121. A light absorbing layer 13 is disposed on a part of an outer side face of the reflection cup 121. A cup opening 122 of the reflection cup 121 is formed by a plurality of successive inner walls, and an included angle α between every two opposite inner walls 123 is 30° to 70°.

When the LED device emits lights, a PN junction of the LED chip is energized and conducted, and the LED chip can convert the electric energy into the light energy to emit light rays. Most of the light rays emitted by the LED chip are directly emitted outside through the encapsulation colloid, but there also may be a part of light rays emitted outside through the encapsulation colloid after being reflected by the inner walls 123 of the reflection cup. Therefore, different angles of the inner walls 123 of the reflection cup cause different light emitting intensities of the LED device when viewing the LED device from different side faces, which influences on the visual effect of viewing. Generally, an angle range of the lights emitted by the LED device is called as a light exiting angle. The light exiting angle is an important index for evaluating performance of the LED device, and a size of the light exiting angle causes an important influence on observability and visibility of the LED device. For example, if the light exiting angle is too large, emitted light rays of the LED device may be not centralized, which causes a loss of light rays reflected by the inner walls 123 of the reflection cup to cause light pollution. If the light exiting angle is too small, an observable angle for viewing may be too small to make imaged pictures viewed from side faces poor. In the embodiment of the present invention, the light exiting angle is between 30° to 70°, so light exiting uniformity is increased and the visual effect is enhanced.

Embodiments of the present invention further provide an LED display screen and an LED device including the above LED bracket.

In an exemplary embodiment, to further increase the light exiting uniformity and enhance the visual effect, an included angle α between every two opposite inner walls 123 is 34° to 65°.

In an exemplary embodiment, to increase the light exiting uniformity and enhance the visual effect accordingly for different LED brackets, for the LED brackets for installing LED chips with models of dimensions, 3528, 2020, 1010, 1212, 1515, 3030, 2525, and 2724, the length range of the LED brackets is 0.9 mm to 3.55 mm, the width range is 0.9 mm to 3.05 mm, and an included angle α between every two opposite inner walls 123 is 34° to 45°.

In another exemplary embodiment, to better enhance the visual effect and increase the light exiting uniformity, both the length range and the width range of the LED brackets are 0.9 mm to 3.05 mm, and the included angle α between every two opposite inner walls 123 is 34° to 40°.

In an exemplary embodiment, to increase the light exiting uniformity and enhance the visual effect accordingly with respect to different LED brackets, for the LED brackets for installing LED chips with models of dimensions, 5050, 3535, 3030, 2727, 2525, 1921, 1515, and 1010, both the length range and the width range of the LED brackets are 1.0 mm to 5.05 mm, an included angle α between every two opposite inner walls 123 is 40° to 70°.

In another exemplary embodiment, to better enhance the visual effect and increase the light exiting uniformity, both the length range and the width range of the LED bracket are 1.45 mm to 3.55 mm, and the included angle α between every two opposite inner walls 123 is 47° to 65°.

In another exemplary embodiment, to increase the light exiting uniformity of the LED chip installed in the LED bracket 1, an asymmetrical structure may be used, and an included angle between one of the two opposite inner walls 123 of the reflection cup 121 and a vertical plane 124 is different from an included angle between the other one of the two opposite inner walls 123 of the reflection cup 121 and the vertical plane 124, wherein the vertical plane 124 is perpendicular to an inner side face 125 of a bottom of the reflection cup 121. The reflection cup 121 is defined as the asymmetrical structure, that is, the sizes of the above two included angles with the vertical plane 124 are mutually different, thereby it is beneficial to further balancing the emitted light rays and increasing the visual effect.

Figure 7:
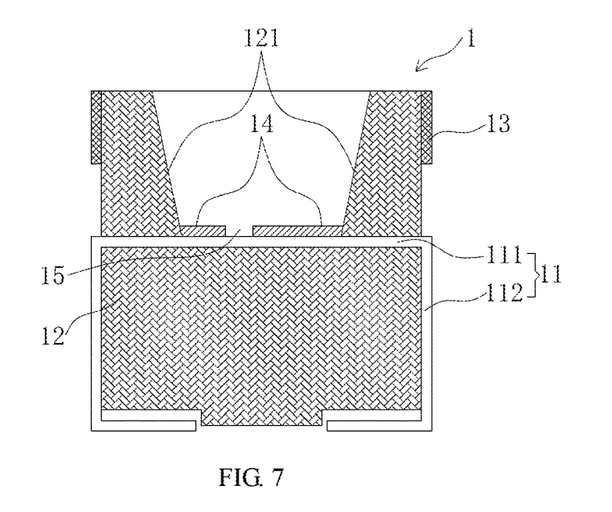
FIG. 7 is a schematic diagram illustrating a lateral view of a non-limiting embodiment of an LED bracket made in accordance with the teachings of the present disclosure.
Figure 8:
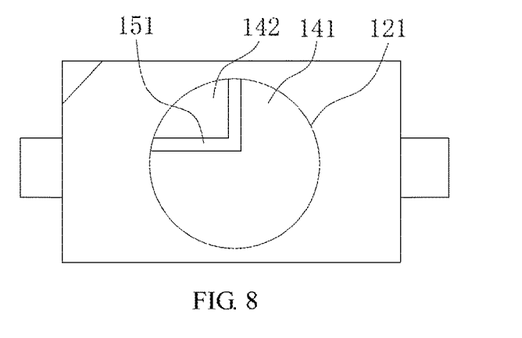
FIG. 8 is a schematic diagram illustrating a top view of the LED bracket provided in the embodiment shown in FIG. 7.

FIG. 7 is a schematic diagram illustrating a lateral view of an LED bracket provided in an embodiment of the present invention. FIG. 8 is a schematic diagram illustrating a top view of the LED bracket provided in an embodiment of the present invention. By referring to FIG. 7 and FIG. 8, in the embodiment, the LED bracket 1 includes: a metal bracket 11 and a cup cover 12 wrapping the metal bracket 11. The metal bracket 11 includes a first metal pin 111 embedded into the cup cover 12 and a second metal pin 112 exposed from the cup cover 12. A part, located on a top of the second metal pin 112, in the cup cover 12 is a reflection cup 121. A light absorbing layer 13 is disposed on a part of an outer side face of the reflection cup 121. Two bonding pads 14 are disposed on an inner side face 125 of the bottom of the reflection cup 121. A river channel 15 is formed by an insulating region between the two bonding pads 14. A width of the river channel 15 is 0.1 μm to 0.25 μm.

Since the size of the LED bracket 1 is limited, the width of the river channel 15 greatly influences arrangement of the chips and a wire bonding technology. On the inner side face, with a certain area, of the bottom of the reflection cup 121, the wider the river channel 15 is, the smaller an effective area of the metal bonding pad 14 is and the stricter requirements for placement regions are during chip fixation. Meanwhile, for a technology for performing circuit conduction using a bonding technique, positions of welding lines may be limited, and an operational window is small, thereby it is not beneficial to industrial production. Moreover, if the width of the river channel 15 is too small, it causes that the adjacent bonding pads 14 on the inner side face 125 of the bottom of the reflection cup 121 are mutually approached and even connected since the LED bracket 1 is easy deformed due to an influence of external force, thereby causing a short circuit of an internal circuit of the LED device and generating series illumination of the LED device. Thus, a reject ratio of the LED devices is increased. In addition, in the industrial production, since incoming materials are supplied in batch, the widths of the river channels 15 of the incoming materials from different batches may be inconsistent. Thus, a die bonding and wire bonding procedure during production of the LED device may be greatly influenced, and the reject ratio may be increased.

In the embodiment of the present invention, the width range of the river channel 15 is researched. The width of the river channel 15 is defined as 0.1 μm to 0.25 μm, thereby satisfying the die bonding and wire bonding requirements, reducing the difficulty of the die bonding and wire bonding, avoiding occurrence of a phenomenon that the large chips cannot be placed in the too small operating window of the die bonding and wire bonding due to a decrease in the area of the bonding pads caused by too wide river channels, and also avoiding short circuit and failure caused by easy contact between the adjacent bonding pads caused by too small width of the river channels. Thus, inspection on the incoming materials is facilitated, difference in batches and the reject ratio is reduced, and industrial production is satisfied.

Embodiments of the present invention further provide an LED device and an LED display screen including the LED bracket, it is beneficial for further satisfying industrial production of the LED device and the LED display screen, further reducing the difference in batches of the LED device and the LED display screen and reducing the reject ratio.

In the embodiment, the bonding pad 14 includes a first bonding pad 141 and a second bonding pad 142, wherein the first bonding pad 141 is configured to fix the LED chip and the second bonding pad 142 is configured to realize electrical connection between the LED chip and the first metal pin 111. The width of the first river channel 151 formed by the insulating region between the first bonding pad 141 and the second bonding pad 142 is 0.1 μm to 0.12 μm or 0.15 μm to 0.25 μm.

In other examples of the present invention, to obtain the better width of the river channel in combination with the structures and the sizes of the bonding pads of the LED bracket, the length range of the LED brackets is 0.9 mm to 3.55 mm, the width range is 0.9 mm to 3.05 mm, and the width of each river channel 15 in the reflection cup 121 is 0.1 μm to 0.12 μm. Or, the length range and the width range of the LED bracket are both 1.0 mm to 5.05 mm, and the width of each river channel 15 in the reflection cup 121 is 0.15 μm to 0.25 μm. In embodiments of the present invention, the widths of the river channels on the inner side faces of the bottom of the reflection cups of the LED brackets of different sizes and specifications are defined respectively, thereby it is beneficial for providing better width of the river channels according to the size of an applied LED bracket so as to satisfy industrial production, reduce the difference in the batches and reduce the reject ratio.

Figure 9:
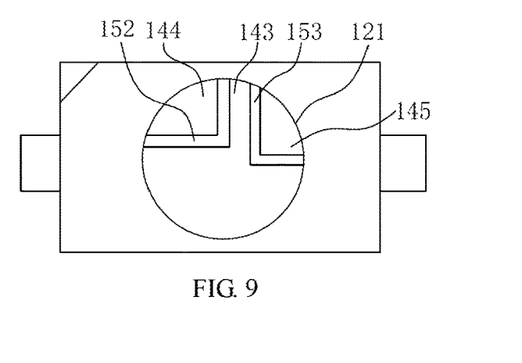
FIG. 9 is a schematic diagram illustrating a top view of another non-limiting embodiment of an LED bracket made in accordance with the teachings of the present disclosure.

FIG. 9 is a schematic diagram illustrating a top view of another LED bracket provided in an embodiment of the present invention. By referring to FIG. 9, in the embodiment, the inner side face of the bottom of the reflection cup 121 is provided with a first die bonding pad 143, a first common wiring bonding pad 144 and a first electrode bonding pad 145. The first die bonding pad 143 is set between the first common wiring bonding pad 144 and the first electrode bonding pad 145. A second river channel 152 is formed by the insulating region between the first die bonding pad 143 and the first common wiring bonding pad 144. A third river channel 153 is formed by the insulating region between the first die bonding pad 143 and the first electrode bonding pad 145. Widths of the second river channel 152 and the third river channel 153 are 0.1 μm to 0.12 μm.

To obtain a better width of the river channel in combination with the structure and the size of the bonding pads of the LED bracket, the length range of the LED bracket 1 is 0.9 mm to 3.55 mm, and the width range is 0.9 mm to 3.05 mm.

Figure 10:
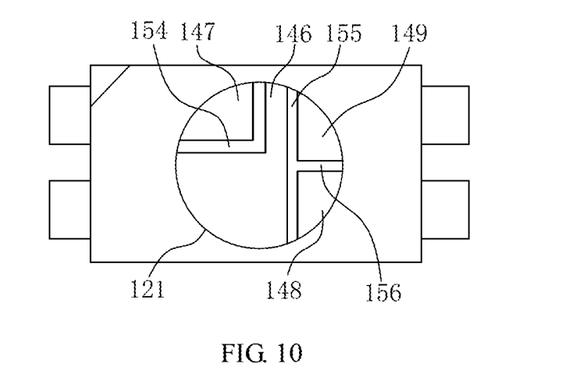
FIG. 10 is a schematic diagram illustrating a top view of another non-limiting embodiment of an LED bracket made in accordance with the teachings of the present disclosure.

FIG. 10 is a schematic diagram illustrating a top view of another LED bracket provided in an embodiment of the present invention. By referring to FIG. 10, in the embodiment, the inner side face of the bottom of the reflection cup 121 is provided with a second die bonding pad 146, a second common wiring bonding pad 147, a second electrode bonding pad 148 and a third electrode bonding pad 149. The second common wiring bonding pad 147 is disposed on the left part of the inner side face of the bottom of the reflection cup 121, the second die bonding pad 146 is disposed on the middle part of the inner side face of the bottom of the reflection cup 121, and the second electrode bonding pad 148 and the third electrode bonding pad 149 are disposed on the right part of the inner side face of the bottom of the reflection cup 121. Every two adjacent bonding pads are separated through an insulating region, and a fourth river channel 154, a fifth river channel 155 and a sixth river channel 156 are respectively formed by the insulating regions between every two adjacent bonding pads. Widths of the fourth river channel 154, the fifth river channel 155 and the sixth river channel 156 are 0.1 μm to 0.12 μm.

To obtain a better width of the river channels in combination with the structure and the size of the bonding pads of the LED bracket 1, the length range of the LED bracket 1 is 0.9 mm to 3.55 mm; and the width range is 0.9 mm to 3.05 mm.

The number of the bonding pads is not limited in the embodiments of the present invention. For example, the number of the electrode bonding pads can also be set as 3, 4 and the like in other examples.

Figure 11:
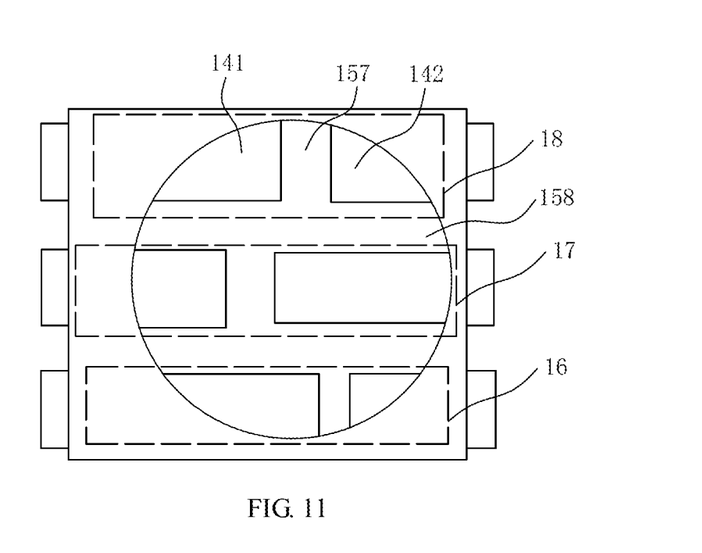
FIG. 11 is a schematic diagram illustrating a top view of another non-limiting embodiment of an LED bracket made in accordance with the teachings of the present disclosure.

FIG. 11 is a schematic diagram illustrating a top view of another LED bracket provided in an embodiment of the present invention. By referring to FIG. 11, in the present embodiment, the inner side face of the bottom of the reflection cup 121 is provided with at least two chip bonding pad groups. In the embodiment, the chip bonding pad groups include a first bonding pad group 16, a second bonding pad group 17 and a third bonding pad group 18. The first bonding pad group 16, the second bonding pad group 17 and the third bonding pad group 18 all include a first bonding pad 141 and a second bonding pad 142. A seventh river channel 157 is formed by an insulating region between the first bonding pad 141 and the second bonding pad 142 in the same group, and an eighth river channel 158 is formed by an insulating region between every two adjacent bonding pad groups. The width of the seventh river channel 157 is 0.15 μm to 0.25 μm, and the width of the eighth river channel 158 is 0.15 μm to 0.25 μm.

To obtain a better width of the river channel in combination with the structure and the size of the bonding pads of the LED bracket, both the length range and the width range of the LED bracket 1 are 1.0 mm to 5.05 mm.

The above embodiments of the present invention define the widths of the river channels on the inner side faces, with different bonding pad structures, of the bottom of the reflection cups of the LED brackets, which is beneficial to provide better widths of the river channels according to the bonding pad structures of the applied LED bracket so as to satisfy industrial production, reduce the difference in different batches and reduce the reject ratio.

Figure 12:
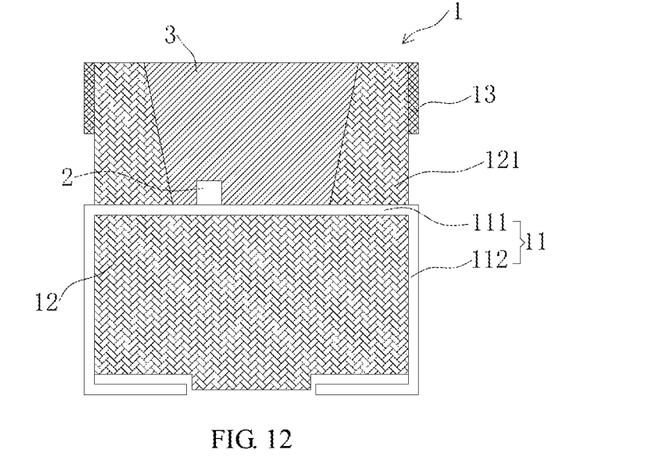
FIG. 12 is a structural schematic diagram illustrating a non-limiting embodiment of an LED device made in accordance with the teachings of the present disclosure.

FIG. 12 is a structural schematic diagram illustrating an LED device provided in an embodiment of the present invention. By referring to FIG. 12, in the embodiment, the LED device includes an LED bracket 1, an LED chip 2 and an encapsulation colloid 3. The LED bracket 1 includes a metal bracket 11 and a cup cover 12 wrapping the metal bracket 11. The metal bracket 11 includes a first metal pin 111 embedded into the cup cover 12 and a second metal pin 112 exposed from the cup cover 12. A part, located on a top of the second metal pin 112, in the cup cover 12 is a reflection cup 121. A light absorbing layer 13 is disposed on a part of an outer side face of the reflection cup 121. The LED chip 2 is disposed in the reflection cup 121 of the LED bracket 1. The encapsulation colloid 3 covers the LED chip 2.

In the embodiment of the present invention, an LED device is provided with a light absorbing layer 13 disposed on the outer side of the reflection cup 121 of the LED bracket, thereby it is beneficial to increasing the contrast ratio and enhancing the light exiting effect. Solutions in the above embodiments of the present invention are particularly applicable to those outdoor LED devices. As an exemplary solution, the light absorbing layer 13 is also disposed on the surface of the top of the reflection cup 121. In other embodiments, the lengths of the light absorbing layers 13 on different sides of the reflection cup 121 can also be set to be different according to different application scenes.

To further increase the contrast ratio of the LED device, in an exemplary embodiment, the encapsulation colloid 3 may be a transparent colloid.

An embodiment of the present invention further provides an LED display screen, formed by uniformly arranging two or more than two LED devices above. To further increase the contrast ratio of the LED display screen, in an exemplary embodiment, a center distance between any two adjacent LED devices may be P2.5. By defining the center distance between any two adjacent LED devices in the LED display screen, the contrast ratio of the LED display screen is further increased.

Figure 13:
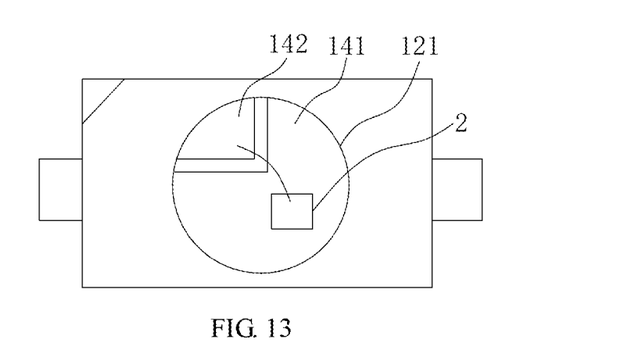
FIG. 13 is a structural schematic diagram illustrating another non-limiting embodiment of an LED device made in accordance with the teachings of the present disclosure.

FIG. 13 is a structural schematic diagram illustrating another LED device provided in an embodiment of the present invention. By referring to FIG. 13, in the embodiment, the LED device includes an LED bracket 1, an LED chip 2 and an encapsulation colloid. The LED chip 2 is disposed in the LED bracket 1. The encapsulation colloid covers the LED chip 2. The LED bracket 1 is an LED bracket having two bonding pads in any above embodiment. A negative pole of the LED chip 2 is fixedly disposed on the first bonding pad 141 on the inner side face of the bottom of the reflection cup 121 of the LED bracket through a conductive adhesive, and a positive pole is welded on the second bonding pad 142 through a bonding wire. The LED chip 2 in the embodiment may be a red-light LED chip.

Figure 14:
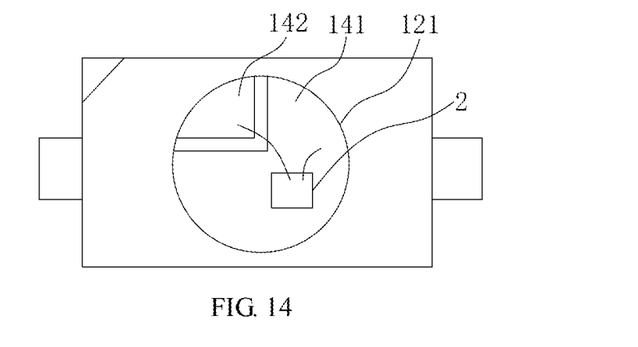
FIG. 14 is a structural schematic diagram illustrating another non-limiting embodiment of an LED device made in accordance with the teachings of the present disclosure.

FIG. 14 is a structural schematic diagram illustrating another LED device provided in an embodiment of the present invention. By referring to FIG. 14, the bottom of the LED chip 2 is fixedly disposed on the first bonding pad 141 on the inner side face of the bottom of the reflection cup 121 of the LED bracket through an insulating adhesive, a negative pole is welded on the first bonding pad 141 through a bonding wire, and a positive pole is welded on the second bonding pad 142 through a bonding wire. The LED chip 2 in the embodiment is a non-red-light LED chip. The LED chip 2 may be a blue-light LED chip or a yellow-light LED chip, and the like. The encapsulation colloid may be a transparent colloid.

Figure 15:
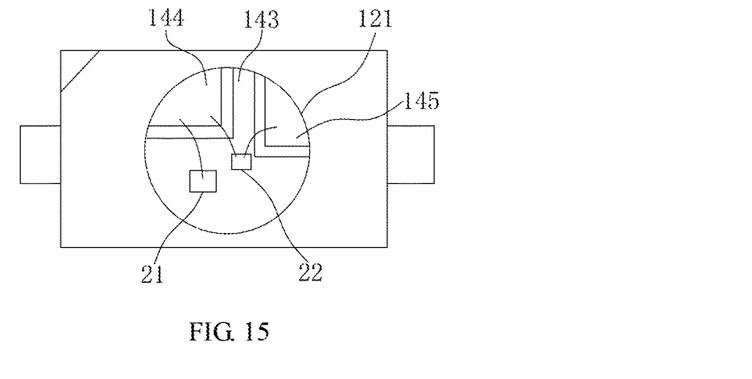
FIG. 15 is a structural schematic diagram illustrating another non-limiting embodiment of an LED device made in accordance with the teachings of the present disclosure.

FIG. 15 is a structural schematic diagram illustrating another LED device provided in an embodiment of the present invention. By referring to FIG. 15, in the embodiment, the LED device includes an LED bracket 1, an LED chip 2 and an encapsulation colloid. The LED chip 2 is disposed in the LED bracket 1. The encapsulation colloid covers the LED chip 2. The LED bracket 1 is an LED bracket having three bonding pads in any above embodiment. In the embodiment, a structure of the bonding wire of the LED chip 2 is described by taking a common anode bonding pad as the first common wiring bonding pad 144 as an example. By referring to FIG. 15, a first LED chip 21 may be a red-light LED chip, a bottom and a negative pole of the first LED chip 21 are fixedly disposed on the first die bonding pad 143 through a conductive adhesive, and a positive pole of the first LED chip 21 is welded on the first common wiring bonding pad 144 through a bonding wire. A second LED chip 22 may be a non-red-light LED chip (such as a blue-light or yellow-light or purple-light LED chip, and the like), a bottom of the second LED chip 22 is fixedly disposed on the first die bonding pad 143 through an insulating adhesive, a top positive pole of the second LED chip 22 is welded on the first common wiring bonding pad 144 through a bonding wire, and a top negative pole of the second LED chip 22 is welded on the first electrode bonding pad 145 through a bonding wire.

In other variation embodiments, the first common wiring bonding pad 144 may be a common cathode bonding pad, and a principle of a specific wiring mode of the common cathode bonding pad is the same as the above principle.

Figure 16:
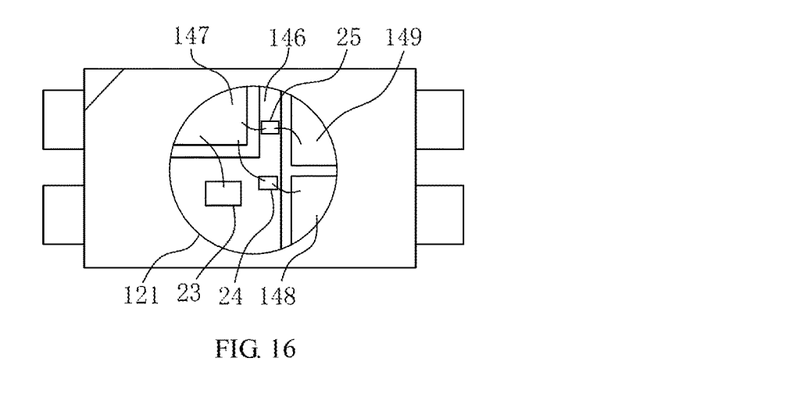
FIG. 16 is a structural schematic diagram illustrating another non-limiting embodiment of an LED device made in accordance with the teachings of the present disclosure.

FIG. 16 is a structural schematic diagram illustrating another LED device provided in an embodiment of the present invention. By referring to FIG. 16, in the embodiment, the LED device includes an LED bracket 1, an LED chip 2 and an encapsulation colloid. The LED chip 2 is disposed in the LED bracket 1. The encapsulation colloid covers the LED chip 2. The LED bracket 1 is an LED bracket having four bonding pads in any above embodiment. In the embodiment, a structure of the bonding wire of the LED chip 2 is described by taking a common anode bonding pad as the second common wiring bonding pad 147 as an example. A third LED chip 23 may be a red-light LED chip, a bottom and a negative pole of the third LED chip 23 are fixedly disposed on the second die bonding pad 146 through a conductive adhesive, and a positive pole of the third LED chip 23 is welded on the second common wiring bonding pad 147 through a bonding wire. A fourth LED chip 24 may be a non-red-light LED chip (such as a blue-light or yellow-light or purple-light LED chip, and the like), a bottom of the fourth LED chip 24 is fixedly disposed on the second die bonding pad 146 through an insulating adhesive, a top positive pole of the fourth LED chip 24 is welded on the second common wiring bonding pad 147 through a bonding wire, and a top negative pole of the fourth LED chip 24 is welded on the second electrode bonding pad 148 through a bonding wire. A fifth LED chip 25 may be a non-red-light LED chip (such as a blue-light or yellow-light or purple-light LED chip, and the like), a bottom of the fifth LED chip 25 is fixedly disposed on the second die bonding pad 146 through an insulating adhesive, a top positive pole of the fifth LED chip 25 is welded on the second common wiring bonding pad 147 through a bonding wire, and a top negative pole of the fifth LED chip 25 is welded on the third electrode bonding pad 149 through a bonding wire.

The number of the bonding pads is not limited in the embodiments of the present invention. The number of the electrode bonding pads and the number of the LED chips can be changed accordingly according to a quantitative relationship between the above electrode bonding pads and the above LED chips.

In other variation embodiments, the second common wiring bonding pad 147 may be a common cathode bonding pad, and a principle of a specific wiring mode of the common cathode bonding pad is the same as the above principle.

Figure 17:
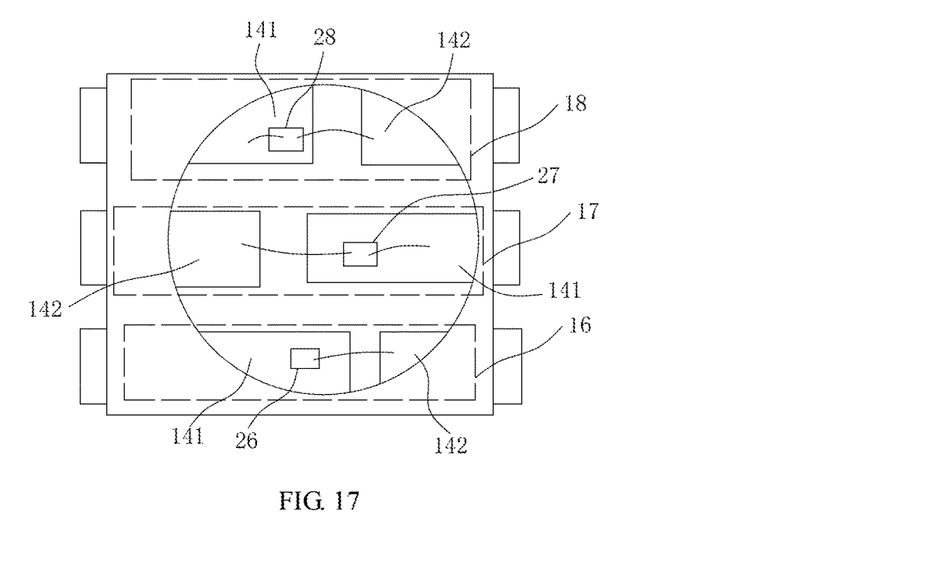
FIG. 17 is a structural schematic diagram illustrating another non-limiting embodiment of an LED device made in accordance with the teachings of the present disclosure.

FIG. 17 is a structural schematic diagram illustrating another LED device provided in an embodiment of the present invention. By referring to FIG. 17, in the embodiment, the LED device includes an LED bracket 1, an LED chip 2 and an encapsulation colloid. The LED chip 2 is disposed in the LED bracket 1. The encapsulation colloid covers the LED chip 2. The LED bracket 1 is an LED bracket having three bonding pad groups in any above embodiment. By referring to FIG. 17, a sixth LED chip 26, a seventh LED chip 27 and an eighth LED chip 28 are respectively in one-to-one correspondence with the first bonding pad group 16, the second bonding pad group 17 and the third bonding pad group 18 in the LED bracket. A bottom and a negative pole of the sixth LED chip 26 are fixedly disposed on the first bonding pad 141 in the first bonding pad group 16 corresponding to the sixth LED chip 26 through a conductive adhesive, and a positive pole of the sixth LED chip 26 is welded on the second bonding pad 142 in the first bonding pad group 16 corresponding to the sixth LED chip 26 through a bonding wire. A bottom of the seventh LED chip 27 is fixedly disposed on the first bonding pad 141 in the second bonding pad group 17 corresponding to the seventh LED chip 27 through an insulating adhesive, a top negative pole of the seventh LED chip 27 is welded on the first bonding pad 141 in the second bonding pad group 17 corresponding to the seventh LED chip 27 through a bonding wire, and a top positive pole of the seventh LED chip 27 is welded on the second bonding pad 142 in the second bonding pad group 17 through a bonding wire. A bottom of the eighth LED chip 28 is fixedly disposed on the first bonding pad 141 in the third bonding pad group 18 corresponding to the eighth LED chip 28 through an insulating adhesive, a top negative pole of the eighth LED chip 28 is welded on the first bonding pad 141 in the third bonding pad group 18 corresponding to the eighth LED chip 28 through a bonding wire, and a top positive pole of the eighth LED chip 28 is welded on the second bonding pad 142 in the third bonding pad group 18 through a bonding wire.

In the embodiments of the present invention, the number of the electrode bonding pads and the number of the LED chips can be changed accordingly to a quantitative relationship between the above electrode bonding pads and the above LED chips.

An embodiment of the present invention further provides an LED display screen which includes an LED device. The LED device is any LED device in the above embodiments. Since the LED display screen provided in the embodiment adopts the above LED device, the contrast ratio of the display screen is high, the light exiting effect is good, industrial batch production can be made, and a pass yield is high.

In description of the present specification, description of reference terms of "an embodiment", "example" and the like means that specific features, structures, material or characteristics described in combination with the embodiment or example are included in at least one embodiment or example of the present invention. In the present specification, illustrative expression of the above terms does not necessarily refer to the same embodiment or example. Moreover, described specific features, structures, material or characteristics can be combined in an appropriate mode in any one or more embodiments or examples.

What is claimed is:

1. A light emitting diode (LED) bracket, comprising:
   a metal bracket and a cup cover wrapping the metal bracket, wherein the metal bracket comprises a first metal pin embedded into the cup cover and a second metal pin exposed from the cup cover, the cup cover comprises a reflection cup located on a top of the second metal pin; and
   a light absorbing layer disposed on only a part of an outer side face of the reflection cup, wherein the light absorbing layer is a black ink layer or a black paint layer,
   wherein the first metal pin comprises a first part, a second part and a third part, and the second part and the third part are inclined downward with respect to the first part.

2. The LED bracket according to claim 1, wherein the light absorbing layer is configured to: extend from a top of the outer side face of the reflection cup to a position close to a bottom of the outer side face of the reflection cup.

3. The LED bracket according to claim 1, wherein the light absorbing layer includes a first light absorbing portion disposed on a first outer side face of the reflection cup and a second light absorbing portion disposed on a second outer side face of the reflection cup opposite to the first outer side face, and a length of the first light absorbing portion in a direction perpendicular to a top of the reflection cup is different from a length of the second light absorbing portion in the direction perpendicular to the top of the reflection cup.

4. The LED bracket according to claim 1, wherein the light absorbing layer includes a third light absorbing layer disposed on a surface of a top of the reflection cup.

5. The LED bracket according to claim 1, wherein a vertical height H of the reflection cup and a vertical distance h between a bottom surface of the light absorbing layer of the outer side face of the reflection cup and the top of the second metal pin meet a relational expression: $0 \leq h \leq \tfrac{2}{3} H$.

6. The LED bracket according to claim 1, wherein a cup opening of the reflection cup is formed by a plurality of successive inner walls, and an included angle α between two opposite inner walls of the reflection cup is 30° to 70°.

7. The LED bracket according to claim 6, wherein a length range of the LED bracket is 0.9 mm to 3.55 mm, a width range of the LED bracket is 0.9 mm to 3.05 mm, and the included angle α between the two opposite inner walls of the reflection cup is 34° to 45°.

8. The LED bracket according to claim 7, wherein both the length range and the width range of the LED bracket are 0.9 mm to 3.05 mm, and the included angle α between the two opposite inner walls of the reflection cup is 34° to 40°.

9. The LED bracket according to claim 6, wherein a length range and a width range of the LED bracket are 1.0 mm to 5.05 mm, and the inclined angle α between the two opposite inner walls of the reflection cup is 40° to 70°.

10. The LED bracket according to claim 9, wherein both the length range and the width range of the LED bracket are 1.45 mm to 3.55 mm, and the included angle α between the two opposite inner walls of the reflection cup is 47° to 65°.

11. The LED bracket according to claim 6, wherein an included angle between one of the two opposite inner walls of the reflection cup and a vertical plane is different from an included angle between the other one of the two opposite inner walls of the reflection cup and the vertical plane, wherein the vertical plane is perpendicular to an inner side face of a bottom of the reflection cup.

12. The LED bracket according to claim 1, wherein at least two bonding pads are disposed on an inner side face of a bottom of the reflection cup, the at least two bonding pads are configured to bear an LED chip and electrically connect the LED chip and the first metal pin; a groove is formed by an insulating region between two adjacent bonding pads, and a width of the groove is 0.1 μm to 0.25 μm.

13. The LED bracket according to claim 12, wherein a length range of the LED bracket is 0.9 mm to 3.55 mm, a width range of the LED bracket is 0.9 mm to 3.05 mm, and the width of each groove in the reflection cup is 0.1 μm to 0.12 μm.

14. The LED bracket according to claim 12, wherein both a length range and a width range of the LED bracket are 1.0 mm to 5.05 mm, and the width of each groove in the reflection cup is 0.15 μm to 0.25 μm.

15. A light emitting diode (LED) device, comprising:
an LED bracket, an LED chip and an encapsulation colloid,
wherein the LED bracket comprises a metal bracket and a cup cover wrapping the metal bracket, the metal bracket comprises a first metal pin embedded into the cup cover and a second metal pin exposed from the cup cover, the cup cover comprises a reflection cup located on a top of the second metal pin, and a light absorbing layer is disposed on only a part of an outer side face of the reflection cup, and the light absorbing layer is a black ink layer or a black paint layer, wherein the first metal pin comprises a first part, a second part and a third part, and the second part and the third part are inclined downward with respect to the first part;
the LED chip is assembled in the reflection cup of the LED bracket; and
the encapsulation colloid covers the LED chip.

16. The LED device according to claim 15, wherein a cup opening of the reflection cup is formed by a plurality of inner walls, and an included angle α between two opposite inner walls of the reflection cup is 30° to 70°.

17. The LED device according to claim 15, wherein at least two bonding pads are disposed on an inner side face of a bottom of the reflection cup, the at least two bonding pads are configured to bear an LED chip and electrically connect the LED chip and the first metal pin; a groove is formed by an insulating region between two adjacent bonding pads, and a width of the groove is 0.1 μm to 0.25 μm.

18. A light emitting diode (LED) display screen, comprising: an LED device,
wherein the LED device comprises an LED bracket, an LED chip and an encapsulation colloid,
wherein the LED bracket comprises a metal bracket and a cup cover wrapping the metal bracket, the metal bracket comprises a first metal pin embedded into the cup cover and a second metal pin exposed from the cup cover, the cup cover comprises a reflection cup located on a top of the second metal pin, and a light absorbing layer is disposed on only a part of an outer side face of the reflection cup, and the light absorbing layer is a black ink layer or a black paint layer, wherein the first metal pin comprises a first part, a second part and a third part, and the second part and the third part are inclined downward with respect to the first part;
the LED chip is assembled in the reflection cup of the LED bracket; and
the encapsulation colloid covers the LED chip.

19. The LED display screen according to claim 18, wherein a cup opening of the reflection cup is formed by a plurality of inner walls, and an included angle α between two opposite inner walls of the reflection cup is 30° to 70°.

* * * * *